United States Patent [19]
Torgerson

[11] Patent Number: 5,537,065
[45] Date of Patent: Jul. 16, 1996

[54] PROGRAMMABLE VOLTAGE DETECTION SYSTEM

[75] Inventor: Paul Torgerson, Iner Grove Heights, Minn.

[73] Assignee: LSI Logic Corporation, Milpitas, Calif.

[21] Appl. No.: 306,765

[22] Filed: Sep. 15, 1994

[51] Int. Cl.$^6$ .............................. H03D 1/00; G01R 19/00; G05F 1/10; G11C 7/00
[52] U.S. Cl. .............................. 327/50; 327/57; 327/530; 327/535; 327/537; 327/538; 327/541; 365/226
[58] Field of Search .............................. 327/50, 55, 57, 327/306, 530, 535, 537, 538, 540, 541, 198, 142, 143; 326/30, 31, 33, 34; 365/226

[56] References Cited

U.S. PATENT DOCUMENTS

| | | | |
|---|---|---|---|
| 4,527,077 | 7/1985 | Higuchi et al. .............................. | 326/33 |
| 4,754,167 | 6/1988 | Conkle et al. .............................. | 327/544 |
| 5,175,706 | 12/1992 | Edme .............................. | 365/226 |
| 5,355,033 | 10/1994 | Jang .............................. | 327/541 |
| 5,361,001 | 11/1994 | Stolfa .............................. | 327/530 |

*Primary Examiner*—David C. Nelms
*Assistant Examiner*—Trong Phan
*Attorney, Agent, or Firm*—John T. McNelis

[57] ABSTRACT

A system and method for detecting the voltage level of a power supply signal and generating a notification signal to indicate when the supply voltage exceeds a minimum voltage that is programmable by a user. A programming signal, that allows for multiple voltages to be detected, is applied to the voltage detection system to generate a notification signal in response to the supply voltage attaining the minimum voltage indicated by the programming signal.

8 Claims, 5 Drawing Sheets

PROGRAMMABLE VOLTAGE DETECTION SYSTEM

BACKGROUND OF THE INVENTION

1. Field of the Invention

The present invention relates generally to the field of voltage detection devices, particularly to power-on reset (POR) circuits.

2. Description of Background Art

A power supply provides voltage signals to digital or analog integrated circuits (IC's). In order for a digital IC to operate properly the supply voltages generated by the power supply must exceed a minimum voltage. In general, the supply voltages supplied to a digital or analog IC are greater than or equal to the voltage used by the internal logic of the IC to differentiate between a binary one and a binary zero. Conventional IC have operating voltages of 5.0 volts. More recent IC have operating voltages of 3.3 volts, 2.4 volts, or 2.0 volts.

A power supply generates a supply voltage upon turn-on that increases (ramps) from zero volts to the operating voltage of the IC. Conventional power supplies may require from a few milliseconds to several hundred milliseconds to generate a supply voltage equal to the operating voltage, i.e., to "power-up" to the operating voltage. While a power supply coupled to an IC is powering-up, the internal logic within the IC is in an unknown state. That is, the value of the logic within each device of an IC is not known.

When an IC that contains a device is turned on it is desirable for the device to be in a known state in order to prevent logical uncertainties and possible damage to the device and the IC. A power-on reset (POR) circuit is a device that solves the above mentioned problems. A POR circuit detects when the power supply voltage signal is at an acceptable voltage level. An acceptable voltage level is the voltage at which the binary values of the internal logic can be accurately predicted. The POR circuit then generates a notification signal that is detected by other IC devices. The notification signal notifies the IC devices that the power supply is generating a supply voltage at an acceptable level.

Conventional POR circuits are designed for devices operating at a particular operating voltage. Such POR circuits detect when the power supply voltage signal has reached the acceptable voltage level for its operating voltage. For example, if an IC has an operating voltage of 3.3 volts, a notification signal may be generated by a POR circuit designed to operate with such an IC when the supply voltage is 2.1 volts. Alternatively, if an IC has an operating voltage of 2.0 volts, a notification signal may be generated by a POR circuit designed to operate with such an IC when the supply voltage is approximately 1.25 volts.

A drawback of conventional POR circuits is that they are limited to working with devices operating only at one particular operating voltage. Accordingly, what is needed is a voltage detection circuit, e.g., a POR circuit, that can operate with devices having different operating voltages.

SUMMARY OF THE INVENTION

The invention is a programmable system and method for detecting the voltage level of an applied signal to generate a notification signal indicating that the applied signal voltage exceeds a minimum voltage. The minimum voltage is programmable by a user. A programming signal is generated and is received by the voltage detection system. The voltage detection system generates a notification signal based upon the minimum voltage indicated by the programming signal.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used.

The invention is directed to a programmable voltage detection system and method for providing a notification signal to devices operating at different voltages.

Figure 1:
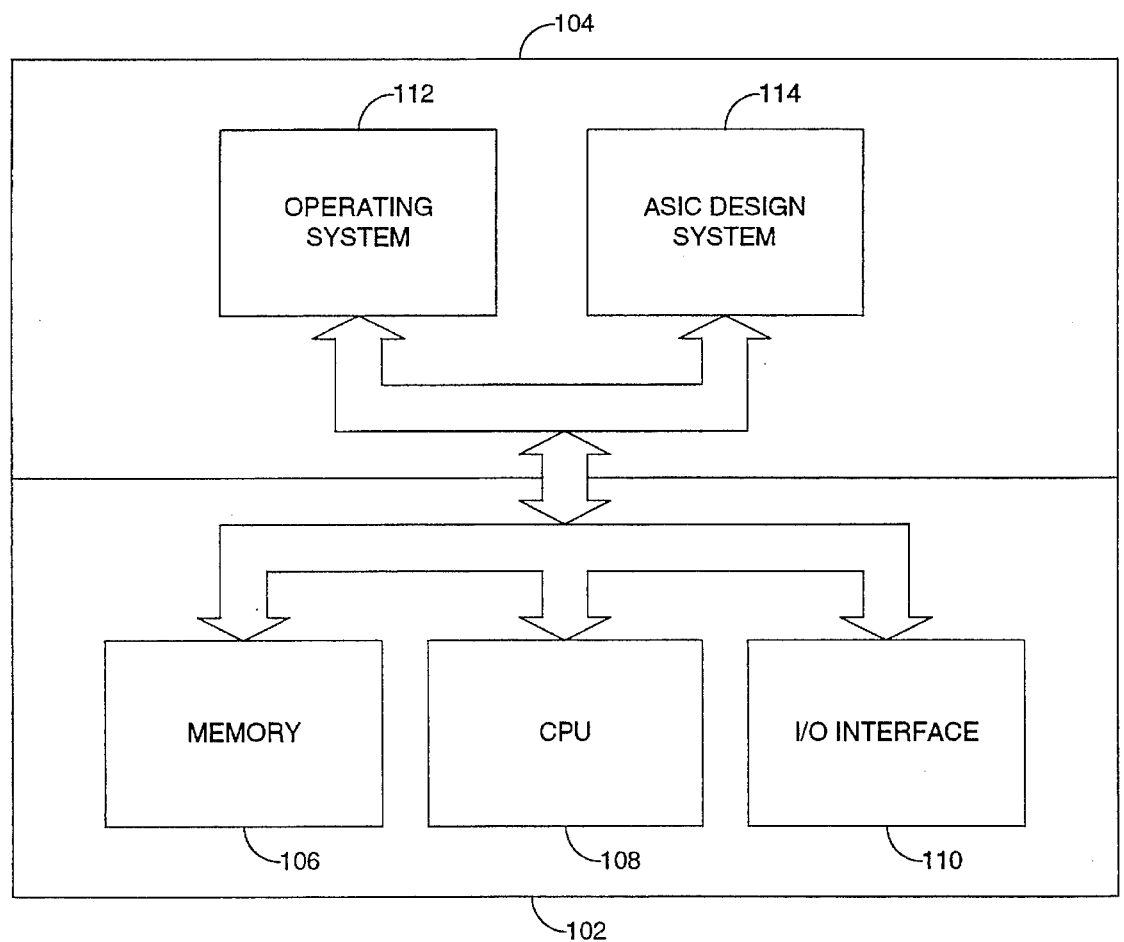
FIG. 1 is an illustration of an environment that designs a circuit comprising the preferred embodiment.

FIG. 1 illustrates an environment that designs an application specific integrated circuit (ASIC) within which the preferred embodiment of the present invention resides. The ASIC is designed using a computer platform 100, e.g., a SPARC station 10 workstation manufactured by Sun Microcomputers, Inc., Mountain View, Calif. The computer platform 100 includes hardware devices 102 and selected programs 104, e.g., software 104, in memory for operating the illustrated system. The hardware devices 102 includes memory 106, one or more central processing units 108 and an input/output (I/O) interface 110. The software 104 includes an operating system 112 and an ASIC design system 114. The operation of the computer platform 100 may be controlled in a conventional manner by microinstruction codes located in memory 106 and executed using the operating system 112. Various techniques for designing an ASIC are described below.

Figure 2:
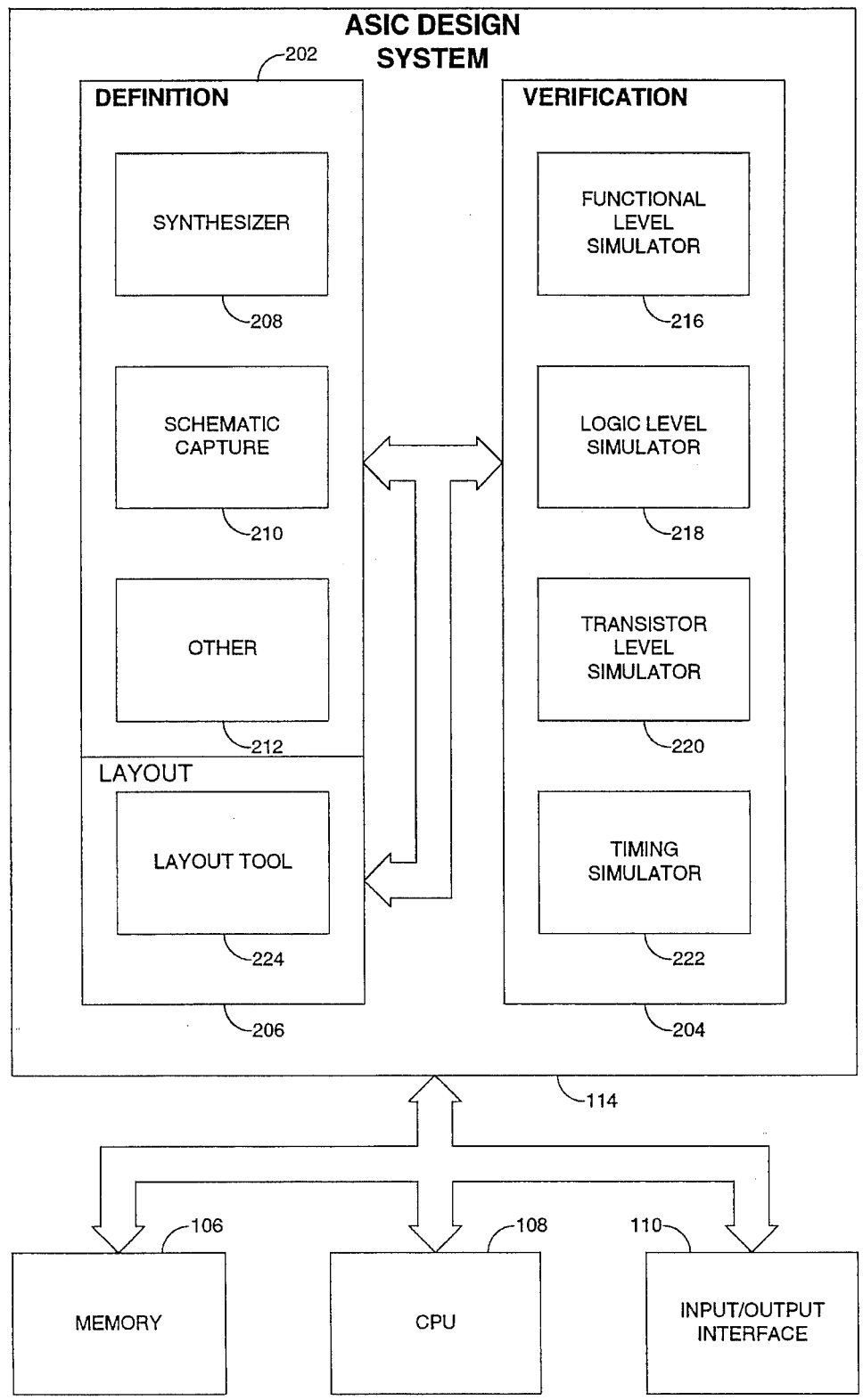
FIG. 2 is an illustration of an application specific integrated circuit (ASIC) design system that designs a circuit comprising the preferred embodiment.

FIG. 2 is a pictorial illustration of the segments of an ASIC design program 114 that designs and lays out ASIC chips. The illustrated ASIC design system 114 includes three general areas, namely: design definition 202; design verification 204 using the simulators 216, 218, 220, 222; and design layout 206 using the layout tool 224. A detailed description of the design definition process 202 is now given.

A design engineer describes the design of an ASIC at various levels of design sophistication. The levels of design sophistication include the functional level, also termed the register transfer level (RTL) or the architectural level, the logic (gate) level and the transistor (layout) level. When designing at the functional level, the design engineer can describe the design of the ASIC using a hardware description language (HDL) such as Verilog or Very High Speed Integrated Circuit Hardware Description Language (VHDL).

The design engineer can also input a functional level design by using conventional schematic entry. When using schematic entry the design engineer creates a functional block diagram of the desired ASIC by choosing the desired functions from a predefined function library, usually stored in computer memory. This library contains a predefined set of functions, the combination of logical elements that defines each function, and the transistor level design of each function. One such predefined function is the programmable POR circuit of the present invention. The programmable POR circuit can be selected by the design engineer to be included in an ASIC design.

A synthesizer program 208 translates a functional level design into a transistor level design by a process called synthesis. A transistor level description of each functional element is located within the predefined function library in memory 106 as is selected by the design engineer. These transistor level descriptions are utilized by the synthesizer 208 during synthesis.

Figure 3:
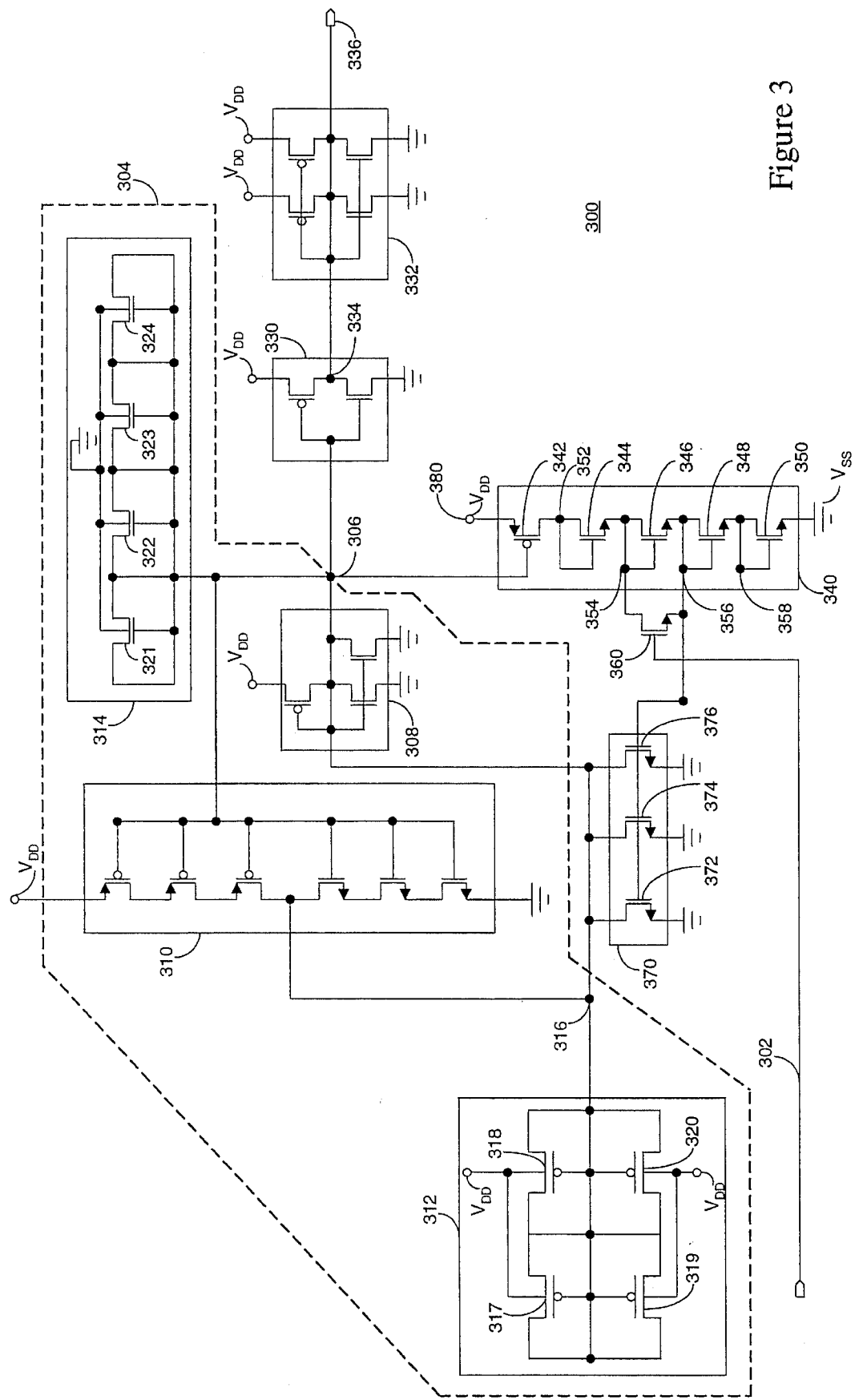
FIG. 3 is a schematic of a programmable power-on reset (POR) circuit according to the preferred embodiment of the present invention.

FIG. 3 illustrates a schematic for the programmable POR circuit 300 that may be stored in the predefined function library for convenient retrieval and fabrication. The POR circuit of FIG. 3 is a gate-array based design but a cell-based POR circuit design may also be fabricated.

In FIG. 3 a latch 304 is coupled to a shunt 370, a voltage divider 340 and an inverter 330. Inverter 330 is coupled to another inverter 332 that generates an output signal at node 336. The gate of transistor 360 is coupled to a programmable node 302. The source and drain of transistor 360 is coupled to the voltage divider 340 and the source of transistor 360 is also coupled to the shunt 370. A more detailed description of these components is given below.

Power is supplied to the ASIC by a power supply (not shown) at the supply voltage $V_{DD}$. As discussed above, when the power supply begins generating a supply voltage, the supply voltage ramps from zero volts to the operating voltage, e.g., $V_{DD}$, of the ASIC. In order to ensure that the internal logic within the ASIC is properly initialized, the ASIC does not use the supply voltage until the supply voltage exceeds a minimum voltage. This minimum voltage is predetermined by the design engineer when designing the ASIC. For example, if the operating voltage of the ASIC is 3.3 volts, the design engineer programs the POR circuit 300 to operate in a 3.3 volt ASIC by coupling node 302 to a "low" voltage ($V_{DD}$), i.e., a voltage representing a logical zero (0). If the operating voltage of the ASIC is 2.0 volts, the design engineer programs the POR circuit 300 to operate in a 2.0 volt ASIC by coupling node 302 to $V_{DD}$, i.e., a voltage representing a logical one (1). A detailed description of the operation of the POR circuit 300 for two ASIC operating voltages, i.e., 3.3 volts and 2.0 volts, is given below.

As described above, FIG. 3 illustrates a POR circuit using gate array technology. Consequently, all transistors in the gate array may have the same width (9.30 micrometers) and length (0.50 micrometers). In addition, the threshold voltage is the same for each transistor and is approximately 0.7 volts. The transistors having a circle adjacent to the gate are p-channel transistors. The remaining transistors are n-channel transistors.

When a power supply is powering up, a stable latch 304 ensures that node 306 has a low voltage, i.e., node 306 is coupled to $V_{SS}$. Latch 304 comprises two inverters 308, 310 and a minimum of two devices 312, 314 configured as illustrated in FIG. 3. Device 312 includes four p-channel transistors 317, 318, 319, 320. The substrate of these p-channel transistors 318, 320 is coupled to $V_{DD}$. Therefore, device 312 maintains a signal at node 316 having a voltage equal to $V_{DD}$. Device 314 includes four n-channel transistors 321, 322, 323, 324 coupled in parallel. The substrate of these n-channel transistors 321, 322, 323, 324 is coupled to a reference potential, $V_{SS}$. Therefore, device 314 couples node 306 to $V_{SS}$, i.e., to ground.

The output of each of the inverters 308, 310 in the latch 304 is coupled to the input of the other of the inverters 310, 308. This feedback arrangement ensures that the latch will be stable, i.e., in a known state, while the power source is powering up. As a result of this configuration, node 306 is coupled to $V_{SS}$, i.e., to ground., as the power supply begins to power-up.

Two inverters 330, 332 are serially coupled to node 306 and the output node 336. These two inverters 330, 332 enable the POR circuit 300 to drive a device having a high output load. Since the logical value of the voltage signal at node 306 is inverted twice, the logical value of the output signal is equal to the logical value of node 306.

A shunt 370 couples node 316 to ground, $V_{SS}$, when the voltage at node 356 is greater than the threshold voltage of the parallel connected transistors 372, 374, and 376, i.e., approximately 0.7 volts. The shunt 370 is capable of quickly reducing the potential at node 316 toward ground potential. The shunt 370 can pass significant current through the three parallel transistors 372, 374, 376 when these transistors 372, 374, 376 conduct, i.e., the shunt 370 is a strong device. When the shunt 370 couples node 316 to ground, $V_{SS}$, the logical state of the latch 304 changes. That is, node 306 is now coupled to the power supply voltage, $V_{DD}$, via inverter 308. Therefore, output node 336 is coupled to the power supply voltage, $V_{DD}$, via inverter 332.

The voltage signal at output node 336 serves as the notification signal. The purpose of the POR circuit 300 is to maintain the potential at node 336 at $V_{SS}$ until the power supply voltage is at a stable voltage level. A stable voltage level is the voltage at which the internal logic of an ASIC device is predictable. Therefore, the transistors 372, 374, 376 comprising the shunt 370 should not conduct until the power supply voltage is at the stable voltage level. The stable voltage level for an ASIC is dependent upon the operating voltage of the ASIC. As described above, an ASIC having an operating voltage of 3.3 volts has a stable voltage level of approximately 2.1 volts. An ASIC having an operating voltage of 2.0 volts has a stable voltage level of approximately 1.25 volts.

The POR circuit 300 provides an accurate notification signal for two different operating voltages. The operation of the POR circuit 300 for each operating voltage is now described.

The voltage signal at node 356 controls the transistors 372, 374, 376 of the shunt 370. As stated above, when the transistors 372, 374, 376 conduct, the POR circuit 300 produces a high voltage, i.e., the notification signal, at node 336. Therefore, the voltage at node 356 should not exceed the threshold voltage of transistors 372, 374, 376 until the supply voltage exceeds the predetermined minimum voltage, described above. The voltage at node 356 is provided by a voltage tree 340 and a transistor 360. The operation of the voltage tree 340 and the transistor 360 is now described.

The voltage tree 340 includes transistors 342, 344, 346, 348, 350 with node 306 coupled to the gate of a p-channel transistor 342. Transistor 342 ensures that the voltage tree will be nonconducting with respect to node 306. As described above, when the power supply begins powering up, the voltage at node 306 is zero volts because node 306 is coupled to ground, $V_{SS}$, via the substrate of device 314 and inverter 308. The power supply voltage signal, $V_{DD}$, is coupled to node 380 of the voltage tree. When the power supply voltage, $V_{DD}$, is one threshold value above the voltage at node 306, i.e., approximately 0.7 volts, p-channel transistor 342 conducts. When transistor 342 conducts, the potential at node 352 is substantially equal to $V_{DD}$.

The gates of transistors 344, 346, 348, 350 are each coupled to the respective drains. Consequently, when transistors 344, 346, 348, 350 conduct, each of these transistors 344, 346, 348, 350 will have a voltage drop across it of at least one voltage threshold value, i.e., approximately 0.7 volts.

If the ASIC operating voltage is equal to 3.3 volts, the gate of transistor 360 is coupled (programmed) to ground, $V_{SS}$, as described above. Consequently, transistor 360 does not conduct and node 354 is not coupled to node 356. When the ASIC operating voltage is 3.3 volts, the power supply supplies a signal having a voltage, $V_{DD}$, between zero volts and 3.3 volts during the power-up period. The stable voltage level, described above, for a device having an operating voltage of 3.3 volts is equal to approximately 2.1 volts. When the power supply generates a signal having a voltage of 2.1 volts the voltage at node 352 is 2.1 volts because transistor 342 is conducting, as described above. Transistor 344 conducts, therefore the voltage at node 354 is 1.4 volts, i.e., one threshold voltage (0.7 volts) less than node 352. Transistor 346 conducts, therefore, the voltage at node 356 is approximately 0.7 volts, i.e., one threshold voltage (0.7 volts) less than node 354. As described above, when the voltage at node 356 is approximately 0.7 volts, transistors 372, 374, 376 of shunt 370 conduct causing the POR circuit to generate a notification signal at node 336.

If the ASIC operating voltage is equal to 2.0 volts, the gate of transistor 360 is coupled (programmed) to the power supply signal, $V_{DD}$, as described above. Consequently, transistor 360 conducts when the power supply signal voltage, $V_{DD}$, is greater than, or equal to, the threshold voltage of transistor 360, i.e., approximately 0.7 volts. When transistor 360 conducts, node 354 is coupled to node 356. When the ASIC operating voltage is 2.0 volts the power supply supplies a voltage, $V_{DD}$, between zero volts and 2.0 volts during the power-up period. The stable voltage level, described above, for a device having an operating voltage of 2.0 volts is approximately 1.25 volts. Thus, when the power supply voltage is 1.25 volts the voltage at node 352 is 1.25 volts because transistor 342 is conducting, as described above. Transistor 344 conducts, therefore the voltage at node 354 is approximately 0.7 volts, i.e., one threshold voltage (0.7 volts) less than node 352. Since node 354 is coupled to node 356 via conducting transistor 360, no voltage drop appears across transistor 346. Therefore, the voltage at node 356 is equal to the voltage at node 354, i.e., 0.7 volts. As described above, when the voltage at node 356 is approximately 0.7 volts, transistors 372, 374, 376 of shunt 370 conduct causing the POR circuit to generate a notification signal at node 336. In the ideal situation, i.e., the transistor threshold voltage is equal to exactly 0.7 volts and no low-power second order effects are present, the stable voltage level for a device having an operating voltage of 2.0 volts is 1.4 volts as opposed to 1.25 volts. However, in practice, the second order effects are present and the threshold voltage is not exactly 0.7 volts.

Figure 4:
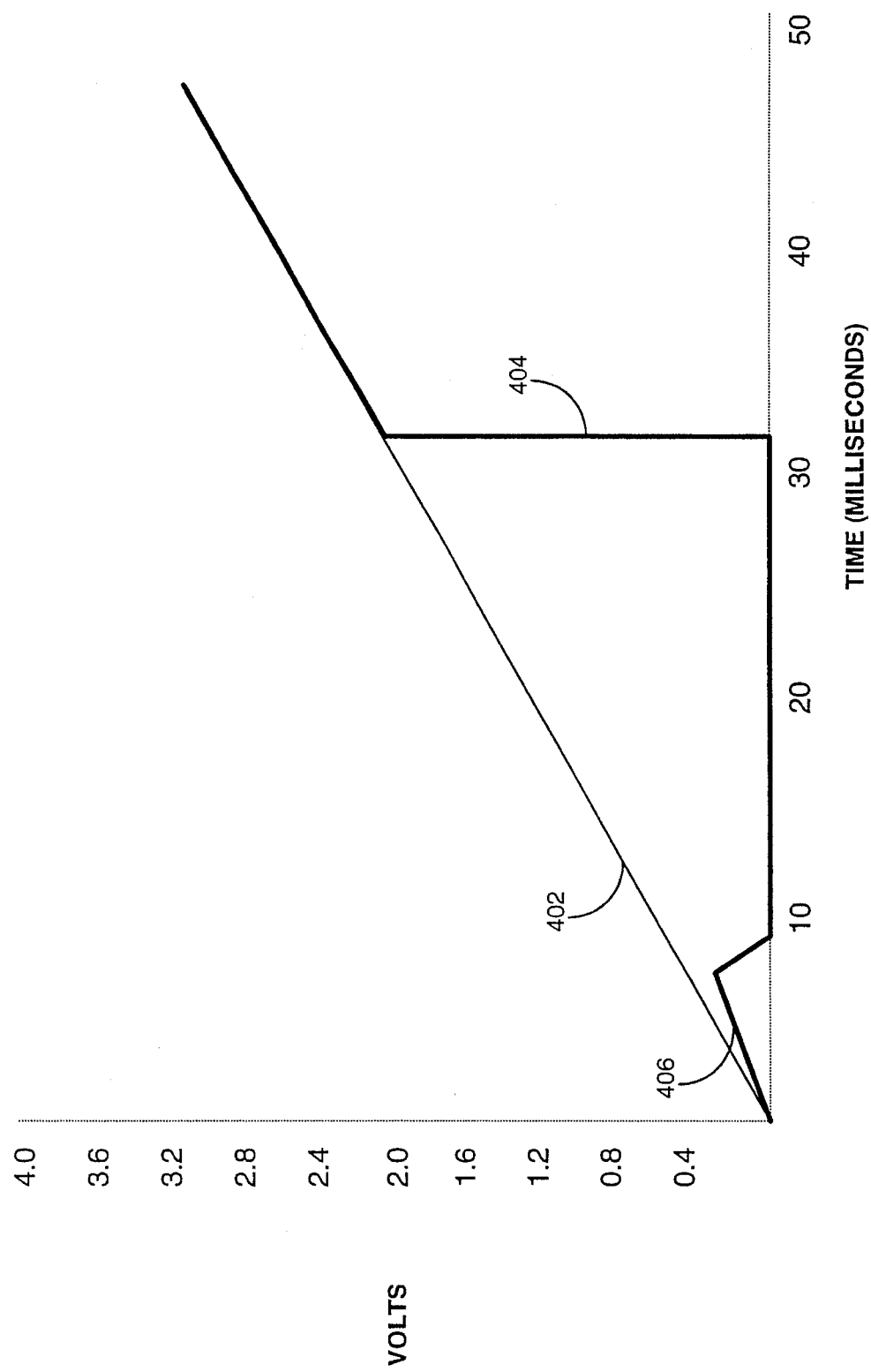
FIG. 4 is an illustration of an example of the operation of the programmable power-on reset (POR) circuit according to the preferred embodiment when programmed to operate in conjunction with a device having an operating voltage of 3.3 volts.

FIG. 4 is a graph that illustrates an example of the operation of the POR circuit 300 when programmed to operate within an ASIC having an operating voltage of 3.3 volts. The power supply signal voltage 402 ramps from 0.0 volts to 3.3 volts in approximately 50 ms. The graph of voltage with time illustrates a voltage 404 representing the voltage at node 336. The voltage 404 initially ramps up 406 and then drops to 0.0 volts, i.e., $V_{SS}$, and remains at 0.0 volts until the power supply signal voltage is approximately 2.1 volts, i.e., at approximately 32 ms. At this time, node 336 is coupled to $V_{DD}$, as discussed above. Thereafter, the voltage at node 336 ramps upward to 3.3 volts in conjunction with the ramp-up of the power supply voltage, $V_{DD}$. The brief voltage ramping 406 at node 336 is a result of a design tradeoff. The voltage ramping 406 is a result of the conductivity of devices 312 and 314. For devices 312, 314 of increased physical size, the voltage ramping 406 decreases. However, one disadvantage of increasing the physical size of devices 312, 314 is the resulting larger POR circuit.

Figure 5:
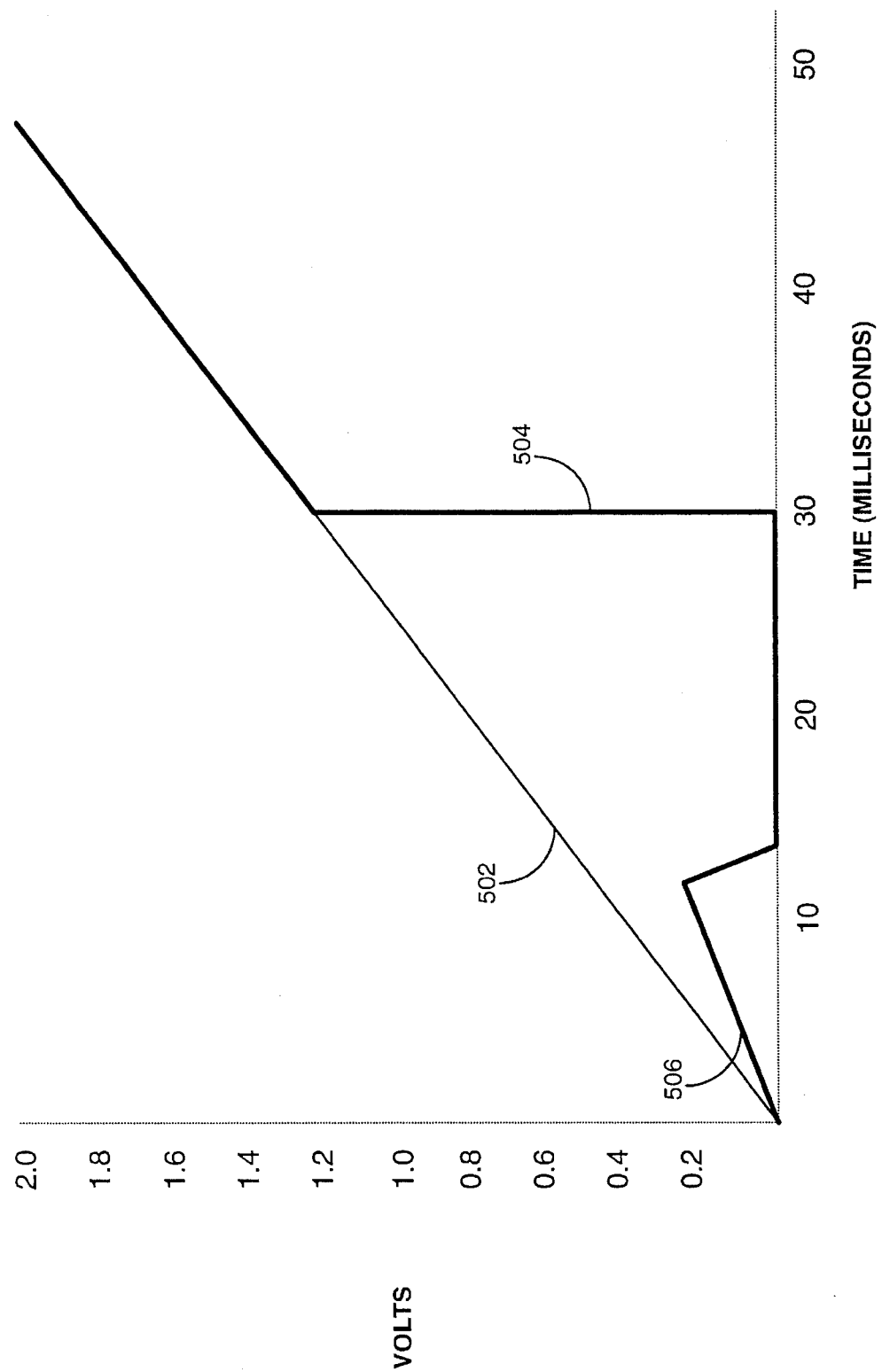
FIG. 5 is an illustration of an example of the operation of the programmable power-on reset (POR) circuit according to the preferred embodiment when programmed to operate in conjunction with a device having an operating voltage of 2.0 volts.

FIG. 5 is a graph that illustrates an example of the operation of the POR circuit 300 when programmed to operate within an ASIC having an operating voltage of 2.0 volts. The power supply signal voltage 502 ramps from 0.0 volts to 2.0 volts in approximately 50 ms. The graph of voltage with time illustrates a voltage 504 representing the voltage at node 336. The voltage 504 initially ramps up 506 and then drops to 0.0 volts, i.e., $V_{SS}$, and remains at 0.0 volts until the supply voltage is approximately 1.25 volts, i.e., at approximately 32 ms. At this time, node 336 is coupled to $V_{DD}$, as described above. Thereafter, the voltage at node 336 ramps upward to 2.0 volts in conjunction with the ramp-up of the power supply voltage, $V_{DD}$. The brief voltage ramping 406 at node 336 is a result of the design tradeoff discussed above.

Alternate embodiments of the present invention include replacing one or more devices in the POR circuit 300 with devices that perform similar functions. For example, the voltage tree transistors 344, 346, 348, 350 can be replaced with resistors. Transistors 372, 374 can be replaced by one large, highly conductive, i.e., strong, transistor that may be wider and shorter than transistors 372, 374. The implementing array based or cell based technology will alter the design possibilities, e.g., in a cell based design not all of the transistors need to have the same width, length, and threshold voltage. The voltage tree 340 can be modified to permit the notification signal to be generated at any two voltages. One technique for modifying the voltage at which the POR circuit 300 generates the notification signal is to modify the number of transistors in the voltage tree 340. Another technique is to use transistors in the voltage tree 340 that have different voltage thresholds.

Another embodiment of the present invention is a non-POR programmable voltage detection device. The present invention permits a programming signal to be placed at node 302. The circuit detects a voltage at node 380. Thus, the user generates a programming signal for application to node 302. The voltage detection device generates a notification signal based upon such programming signal and the voltage at node 380.

Another embodiment of the present invention utilizes one or more additional programmable transistor to perform a function similar to transistor 360. The addition of one or more programmable transistors enable a voltage detection circuit, e.g., a POR circuit, to be responsive to many voltage levels at node 380.

The present invention increases the flexibility of voltage detection devices. When an ASIC library contains descriptions of devices having different operating voltages, the programming feature of present invention facilitates storing and maintaining only the one programmable voltage detection device, e.g., the programmable POR circuit according to the present invention.

What is claimed is:

1. A voltage detection system for generating an output voltage signal in response to a supply voltage attaining a selected level, the system comprising:

a voltage divider having a first input, a first output and a second output, for receiving the supply voltage at said first input and generating a first voltage signal at said first output and a second voltage signal at said second output, said voltage divider comprises a first device coupled between said first output and said second output;

a first controllable switch, having a third output and a first control input coupled to receive a programmable input signal, for generating the third voltage signal at said third output by electrically coupling said third output to one of said first output and said second output in response to said programmable input signal, said first controllable switch comprises a first transistor having a source and a drain, and having a gate coupled to said programmable input signal, with said drain coupled to said first output and said source coupled to said second output and said third output; and a second device having a control input coupled to said third output, a supply input node coupled to the voltage supply, and a fourth output, said second device coupling said supply input node to said fourth output in response to said control input coupled to said first output via said third output, said output voltage signal being on said fourth output.

2. A voltage detection system for generating an output voltage signal in response to a supply voltage attaining a selected level, the system comprising:

a voltage divider having a first input, a first output and a second output, for receiving the supply voltage at said first input and generating a first voltage signal at said first output and a second voltage signal at said second output, said voltage divider comprises a first device coupled between said first output and said second output;

a first controllable switch, having a third output and a first control input coupled to receive a programmable input signal, for generating a third voltage signal at said third output by electrically coupling said third output to one of said first output and said second output in response to said programmable input signal, said first controllable switch comprises a first transistor having a source and a drain, and having a gate coupled to said programmable input signal, with said drain coupled to said first output and said source coupled to said second output and said third output;

a latch having a first latch input, and a first latch output, and a second latch output coupled to said second input of said voltage divider, said first latch input coupled to receive the supply voltage; and a controllable shunt having a control input coupled to said third output, for providing a low resistance path from said first latch output to a reference potential in response to said control input;

an output voltage node having the output voltage signal, said output voltage node coupled to said second latch output and said second latch output coupled to the supply voltage when said first latch output is coupled to said reference potential.

3. The system of claim 2, wherein said first voltage signal is generated by a power supply.

4. The system of claim 2, wherein said first device comprises a second transistor having a second gate and a second source, and having a second drain coupled to said first output.

5. A voltage detection system for generating a notification signal in response to a supply voltage attaining a selected level, the system comprising:

a voltage divider having a first input, a first output, and a second output, for receiving the supply voltage at said first input and generating a first voltage signal at said first output and a second voltage signal at said second output;

a controllable switch, having a third output and a first control input coupled to receive a programmable input signal, for generating a control voltage at said third output by electrically coupling said third output to one of said first output and said second output in response to said programmable input signal;

a latch, having a latch input, a first latch output and a second latch output, for generating the notification signal at said second latch output when said first latch output is coupled to a reference potential; and a shunt, having a shunt input and a control input, said shunt input coupled to said first latch output and said control input coupled to receive said control voltage, for coupling said first latch output to said reference potential when said control voltage exceeds a threshold voltage.

6. The system of claim 5, wherein said controllable switch comprises a first transistor having a first gate, a first source, and a first drain, said first gate coupled to receive said programmable input signal, said first drain coupled to said first output, said first source coupled to said second output and to said shunt input.

7. The system of claim 5, wherein said voltage divider comprises a resistive device having a second input and said second output, said second input coupled to said first output.

8. The system of claim 7, wherein said resistive device comprises a second transistor having a second source and a second drain, said second source coupled to said first output, said second drain coupled to said second output.

* * * * *